United States Patent [19]
West et al.

[11] Patent Number: 5,483,091
[45] Date of Patent: Jan. 9, 1996

[54] CHARGE-COUPLED DEVICE ARRAY FOR SPECTROSCOPIC DETECTION

[75] Inventors: John S. West, Yardley, Pa.; Raymond W. Simpson, Hamilton Square; Samuel C. Khoo, Lawrenceville; Yair Talmi, Princeton; Raymond A. Nadolny, Trenton, all of N.J.; Morley M. Blouke, Portland, Oreg.

[73] Assignees: Scientific Imaging Technologies, Inc., Beaverton, Oreg.; Princeton Instruments, Inc., Trenton, N.J.

[21] Appl. No.: 404,946

[22] Filed: Mar. 14, 1995

Related U.S. Application Data

[63] Continuation of Ser. No. 189,577, Jan. 31, 1994, abandoned.

[51] Int. Cl.[6] .................. H01L 27/148; H01L 29/768
[52] U.S. Cl. .................. 257/239; 257/231; 257/240; 257/241
[58] Field of Search .................. 257/232, 233, 257/240, 241, 239, 231

[56] References Cited

U.S. PATENT DOCUMENTS

| | | |
|---|---|---|
| 3,851,096 | 11/1974 | Collins et al. . |
| 4,001,878 | 1/1977 | Weimer . |
| 4,165,539 | 8/1979 | Aichelmann, Jr. . |
| 4,237,383 | 12/1980 | Kosonocky et al. . |
| 4,490,744 | 12/1984 | Levine . |
| 4,513,313 | 4/1985 | Kinoshita et al. . |
| 4,559,550 | 12/1985 | Koike et al. . |
| 4,641,963 | 2/1987 | Levine . |
| 4,694,316 | 9/1987 | Chabbal . |
| 4,744,087 | 5/1988 | Descure et al. .................. 257/232 |
| 4,750,042 | 6/1988 | Murayama et al. . |
| 4,774,586 | 9/1988 | Koike et al. . |
| 4,807,037 | 2/1989 | Lesaka et al. . |
| 4,837,630 | 6/1989 | Ueda . |
| 4,862,274 | 8/1989 | Cazaux . |
| 4,908,518 | 3/1990 | Losee et al. . |
| 4,949,183 | 8/1990 | Stevens . |
| 4,987,466 | 1/1991 | Shibata et al. . |
| 5,040,071 | 8/1991 | Stevens . |

FOREIGN PATENT DOCUMENTS 59-33864  2/1984  Japan .................. 257/241

*Primary Examiner*—Ngô Ngân V.
*Attorney, Agent, or Firm*—Smith-Hill and Bedell

[57] ABSTRACT

A CCD comprises a sensing array and a readout register extending adjacent an edge of the sensing array. The readout register has first and second rows of transfer cells. The first row of transfer cells is between the sensing array and the second row. The transfer cells of the first row are of lower capacity than the transfer cells of the second row and are separated from the transfer cells of the second row by a potential barrier.

23 Claims, 4 Drawing Sheets

CHARGE-COUPLED DEVICE ARRAY FOR SPECTROSCOPIC DETECTION

This is a continuation of application No. 08/189,577 filed Jan. 31, 1994 now abandoned.

CROSS-REFERENCE TO RELATED APPLICATION

Some of the subject matter that is disclosed in this application is also disclosed in patent application Ser. No. 08/189,579 filed concurrently with patent application Ser. No. 08/189,577, now U.S. Pat. No. 5,432,335, the disclosure of which is hereby incorporated by reference herein.

BACKGROUND OF THE INVENTION

This invention relates to a charge-coupled device for spectroscopic detection.

In emission spectroscopy, a specimen is heated to incandescence and the light emitted by the specimen is collimated, dispersed in accordance with wavelength, and focused in an image plane. The intensity of light in the image plane varies along a wavelength axis, and FIG. 1 illustrates variation of intensity in the image plane with position along the wavelength axis. In absorption spectroscopy, a beam of light is incident on an absorbent specimen, and the transmitted light is dispersed in accordance with wavelength and is focused in an image plane. In each case, the distribution of light intensity as a function of wavelength is dependent on the composition of the specimen.

It is known to measure the distribution of light intensity as a function of wavelength in emission or absorption spectroscopy by use of a charge-coupled device (CCD). FIG. 2 illustrates schematically a known form of CCD 10. The CCD shown in FIG. 2 comprises a die made of monocrystalline silicon into which various impurities have been implanted using conventional integrated circuit fabrication techniques. The pattern of impurity type and concentration defines a rectangular sensing region 14 composed of multiple columns extending perpendicular to the longer dimension of the sensing region 14. For convenience, it will be assumed in the following discussion that wavelength varies along a horizontal axis and that the columns are vertical, as shown in FIG. 2.

A three-phase frame electrode structure 16 (FIG. 3) traverses the columns of the sensing region. The frame electrode structure is connected to a three-phase clock driver (not shown) that applies selected voltage levels to the electrodes and thereby establishes a potential profile as shown by the dashed line 19, dividing each column into multiple pixels 18. It will be understood that although the sensing region 14 shown in FIG. 2 is composed of only 100 pixels, a practical CCD for spectroscopic detection might have well over 100,000 pixels. Also, although, the pixels are shown in FIG. 2 as being square, this is not necessary.

The CCD is placed in the image place of the spectrometer so that the longer dimension of the rectangular sensing region is disposed parallel to the wavelength axis of the spectrum provided by the spectrometer. Therefore, each column of pixels is associated with an interval in the wavelength range. Photons that are incident on a particular pixel of the sensing region result in generation of photoelectrons in the semiconductor die at a rate that depends on the intensity of light incident on the pixel, and photoelectrons that do not recombine with holes are retained in the pixel by potential barriers that bound the pixel. Thus, the size of the charge packet accumulated in a given column of pixels during an exposure interval is representative of the intensity of light within the wavelength range associated with that column, and the distribution of size of charge packets along the wavelength axis represents the distribution of light intensity as a function of wavelength in the light beam provided by the sample.

Along one horizontal edge of the rectangular sensing region there is a readout register 22. As shown in FIG. 2, the readout register extends parallel to the wavelength axis. Referring to FIG. 3, the readout register 22 is bounded along its edge that is farther from the sensing region 14 by a potential barrier 28. The readout register comprises one charge transfer cell 26 for each column of pixels in the sensing region of the CCD. The readout register also comprises a so-called floating diffusion 30 at one end. The floating diffusion is coupled to a readout amplifier 34.

The clock driver enables voltages to be applied to the frame electrode structure in a sequence that allows the charge packet accumulated in each column of pixels during the exposure period to be transferred into the corresponding transfer cell 26 of the readout register 22. In addition, a readout electrode structure 38 overlies the transfer cells of the readout register and by clocking the electrodes of the readout electrode structure in ordered sequence, the charge packets in the readout register are transferred to the floating diffusion.

A so-called last cell, controlled by a last gate or transfer gate electrode 40, is between each column of pixels in the sensing region and the associated transfer cell 26 of the readout register. However, this is conventional and is not relevant to the invention, and therefore will not be described further.

As charge packets are shifted from the readout register into the floating diffusion 30, the potential of the input terminal of the amplifier 34 varies in accordance with the size of the charge packets. In this manner, the variation along the wavelength axis in size of charge packets is converted to a time-varying voltage signal.

The output signal of the amplifier 34 is applied to processing circuitry (not shown) for extracting information from the signal. Generally, the readout amplifier 34 is fabricated on the same die as the CCD 10, but the processing circuitry is not.

As shown in FIG. 4, the readout register could extend in the direction perpendicular to the wavelength axis, with each column of pixels being clocked sequentially into the readout register and then accumulated in the floating diffusion at the end of the readout register. This is subject to disadvantage unless a shutter is used to prevent illumination of the array during readout, because charge accumulated during the readout operation is not added on a wavelength basis to the charge accumulated prior to the readout operation.

A typical silicon die that is processed to form a CCD has a thickness of about 0.1 mm and the sensing region extends to a depth of about 5–10 μm below the surface at which the die is processed to form the CCD. The frame electrode structures lie over this surface, which is commonly known as the front side of the die.

If the optical signal is incident on the sensing region by way of the front side of the die, the optical signal is partially blocked by the frame electrode structure. In application of a CCD to imaging very faint optical signals, for example astronomical applications, it is known to thin the die from the back side to a thickness of about 10 μm and illuminate the CCD from the back side of the die in order to avoid this problem.

The minimum noise level of an optical signal is the square root of the mean number of photons in the optical signal. Similarly, when the optical signal is converted to an electrical signal using a CCD, the noise level is at least the square root of the mean number of photoelectrons in the signal. Thus, to measure the electrical output signal of the CCD to a precision of 1 part in 1,000 requires that the signal be composed of at least 1 million photoelectrons, because the minimum noise of a 1 million electron signal is 1,000 electrons, or 1 part in 1,000 of the signal.

Another source of noise in the output signal of the CCD is the noise that is generated in the readout process itself. The level of noise that is generated in the readout process depends mainly on the readout amplifier. A readout amplifier that is designed to accommodate small charge packets adds less noise than a readout amplifier designed to accommodate large charge packets. Naturally, the size of the readout amplifier depends on the size of the charge packets that are expected in use. The charge capacity of the transfer cells of the readout register is representative of the size of the charge packets that are expected.

In the present state of the art, a compromise is made between the size of the charge packets that are provided to the readout register, as represented by the charge capacity of the readout register, and the readout noise of the readout amplifier, such that the dynamic range of the output signal cannot exceed about 200,000:1.

In CCDs that are currently used for spectroscopic detection, the charge capacity of the readout register is not significantly greater than the charge capacity of the sensing region. This imposes a limit on the number of electrons in the signal provided by the readout register, so that the signal to noise ratio cannot be increased by making multiple exposures and accumulating the charge packets in the transfer cells prior to readout.

A problem that arises in manufacture of integrated circuits in general and CCDs in particular is that of yield. If multiple devices are fabricated under nominally identical conditions and to nominally identical designs, a significant proportion of the finished devices will not function to specifications. Generally, the number of faulty devices will depend on the complexity of the design, since as complexity increases, tolerances normally decrease.

SUMMARY OF THE INVENTION

In accordance with a first aspect of the present invention there is provided a CCD comprising a sensing array and a readout register extending adjacent an edge of the sensing array, wherein the readout register has first and second rows of transfer cells, the first row being between the sensing array and the second row, and the transfer cells of the first row are of lower capacity than the transfer cells of the second row and are separated from the transfer cells of the second row by a potential barrier.

In accordance with a second aspect of the present invention there is provided a CCD comprising a sensing array and a readout register extending adjacent an edge of the sensing array, the readout register having at least one charge accumulation cell for receiving and accumulating charge shifted into the accumulation cell from a source cell of the CCD, and wherein the charge accumulation cell has a first sub-cell and a second sub-cell of greater capacity than the first sub-cell, the first sub-cell being between the source cell and the second sub-cell and being separated from the second sub-cell by a potential barrier.

In accordance with a third aspect of the present invention there is provided a CCD comprising a sensing array having first and second sensing regions, the sensing array having first and second edges bounding the first and second sensing regions respectively, and the CCD further comprising a first readout register means adjacent the first edge of the sensing array, a second readout register means adjacent the second edge of the sensing array, and an electrode means operative selectively for shifting charge from the sensing array either to the first readout register means or to the second readout register means, and wherein the first readout register means has first and second rows of transfer cells, the first row being between the sensing array and the second row, and the transfer cells of the first row are of lower capacity than the transfer cells of the second row and are separated from the transfer cells of the second row by a potential barrier.

In accordance with a fourth aspect of the present invention there is provided a CCD comprising a sensing array and a readout register extending adjacent an edge of the sensing array, wherein the charge capacity of the readout register is more than twice the charge capacity of the sensing array.

In accordance with a fifth aspect of the present invention there is provided a CCD comprising a sensing array having first and second edges, and first and second readout registers extending adjacent said first and second edges respectively of the sensing array, wherein at least the first readout register has first and second rows of transfer cells, the first row being between the sensing array and the second row, and the transfer cells of the first row are of lower capacity than the transfer cells of the second row and are separated from the transfer cells of the second row by a potential barrier.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 5:
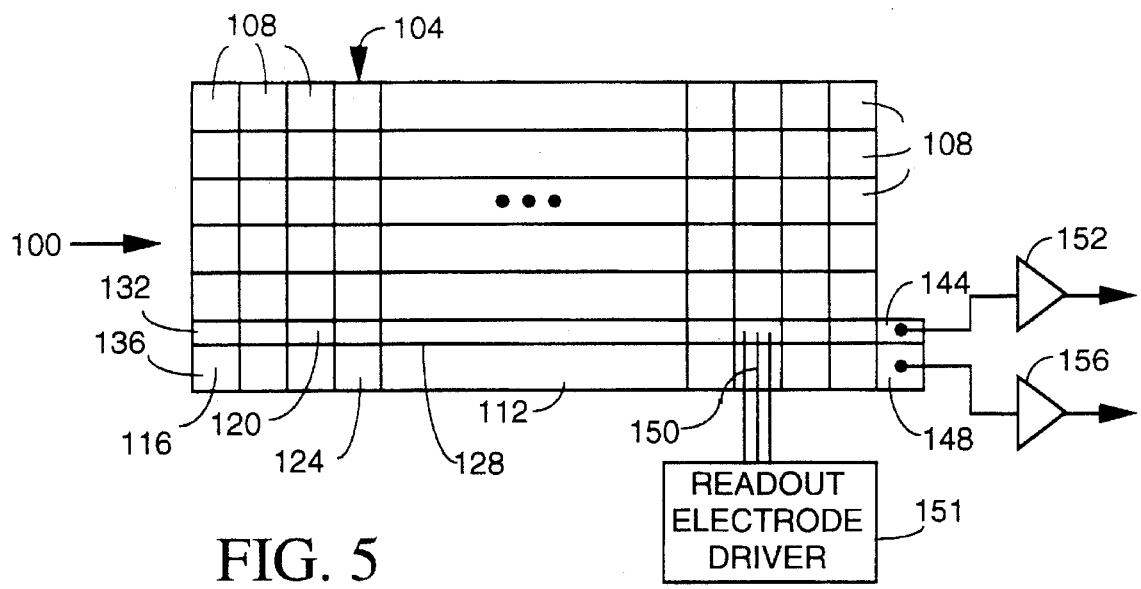
FIG. 5 is a diagrammatic plan view of a first CCD embodying the present invention.

FIG. 5 shows a CCD 100 that has a sensing region 104, composed of a rectangular array of photosensitive pixels 108, and a read out register 112 along one of the longer edges of the sensing region. It is preferred that the CCD be a thinned CCD that is illuminated from the back side. The read out register comprises a row of transfer cells 116, each comprising two wells or sub-cells 120 and 124 separated by a potential barrier 128 (see also FIG. 6). Thus, the readout register comprises a row 132 of wells 120 and a row 136 of wells 124. The readout register 112 is bounded along its edge that is farther from the sensing region 104 by a potential barrier 134 that is substantially higher than the potential barrier 128 between the wells 120 and 124. The charge capacity of the well 120 is substantially less than the charge capacity of the well 124. This is illustrated schematically in FIG. 6 by showing the two wells 120, 124 with substantially equal potential depth and the well 120 substantially narrower than the well 124. However, it will be appreciated that other relationship between the variables that establish the capacity of the wells may be employed to achieve the desired relationship between the capacities of the wells respectively.

The charge capacity of the cell 116 is at least twice the total charge capacity of the associated column of pixels 108, and is preferably at least six times the capacity of the column of pixels 108. Accordingly, the overall capacity of the readout register is at least twice, and preferably at least six times, the capacity of the pixels of the sensing region. This allows the readout register to handle a substantially greater charge signal than has previously been conventional, thereby increasing the signal to noise ratio.

Figure 6:
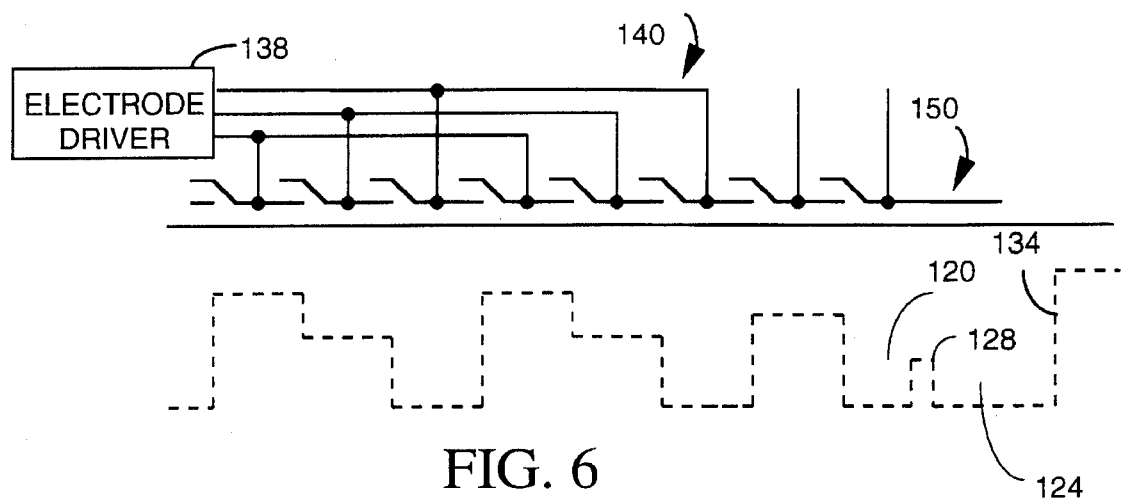
FIG. 6 is a partial sectional view of the CCD shown in FIG. 5, illustrating variation in potential in a segment of one column of pixels and the associated transfer cell of the readout register.

A three-phase frame electrode structure 140 overlies the front side of the sensing region and is connected to a three-phase electrode driver 138 (FIG. 6). By employing the electrode driver 138 to apply appropriate potentials to the frame electrode structure, pixel charges are shifted progressively into the associated wells 120 of the read out register. If the charge packet that is shifted into a well 120 from the corresponding column of the sensing region is large enough, it fills the well 120 and excess charge overflows from that well into the well 124. In this manner, a large charge packet may be divided into two sub-packets in the wells 120 and 124 respectively.

Referring to FIG. 5, floating diffusions 144 and 148 are provided at an output end of the rows 132 and 136 respectively. A readout electrode 150 structure overlies the readout register and is driven by a readout electrode driver 151 to shift the charge packets parallel to the wavelength axis toward the output end of the readout register where they enter the floating diffusions 144 and 148. Two readout amplifiers 152 and 156 provide voltage signals representative of the level of charge in the floating diffusions 144 and 148 respectively.

Since the wells 120 are quite small, the row 132 of the read out register has relatively high sensitivity, in that each additional electron that is shifted into a well of the first row (before that well overflows into the associated well of the second row) influences the charge sensed by the amplifier 152.

Figure 7A:
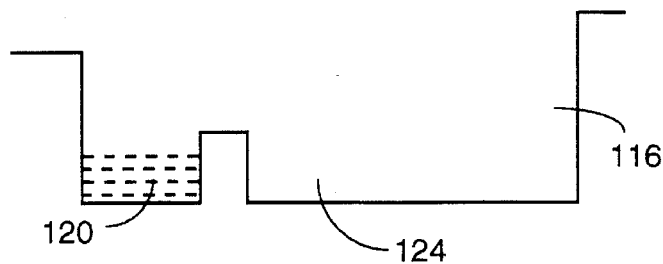
FIGS. 7A–7D are graphs illustrating operation of the readout register of the CCD shown in FIG. 5 at various signal levels.
Figure 7B:
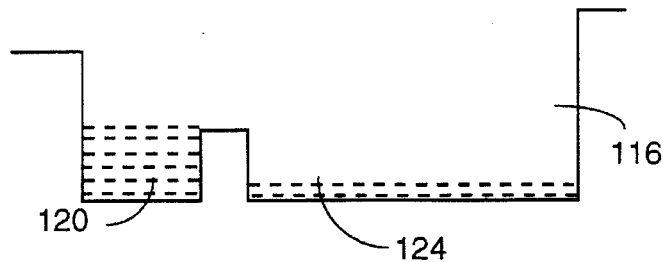
Figure 7C:
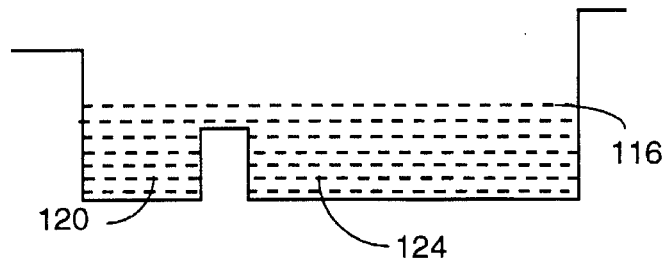
Figure 7D:
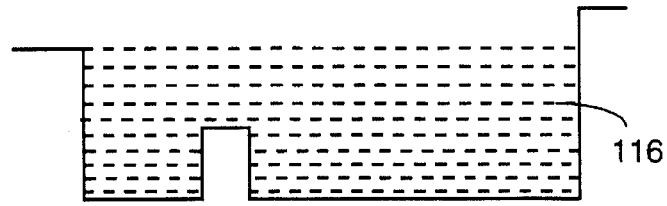
Figure 8:
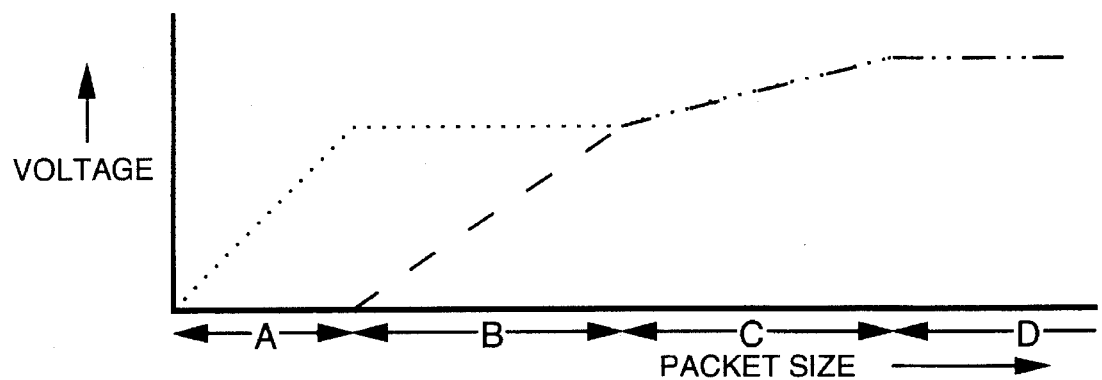
FIG. 8 is a graph illustrating a feature of operation of the CCD shown in FIG. 5.

Operation of the dual sensitivity readout register has four distinct ranges. At low signal levels (FIG. 7A and range A in FIG. 8), the charge packet that is accumulated in a transfer cell 116 by shifting the pixel charges of the associated column of the sensing region into the transfer cell is fully accommodated in the well 120. Each additional electron that enters the cell 116 remains in the well 120 and when the charge packet reaches the floating diffusion 144, the presence of the additional electron influences the voltage at the input of the readout amplifier 152. Thus, referring to the dotted line in FIG. 8, over the range A the slope of the curve relating the voltage detected at the input of the amplifier 152 to packet size is fairly high. At somewhat higher signal levels (FIG. 7B and range B in FIG. 8), the charge packet is sufficient to fill the well 120, and excess charge transferred into the cell 116 overflows into the well 124. The voltage at the input of the amplifier 152 remains constant and each additional electron that enters the cell 116 affects only the potential level in the well 124. Since the floating diffusion 148 is larger than the floating diffusion 144, the slope of the curve relating voltage at the input of the amplifier 156 to packet size (the dashed line in FIG. 8) in range B is less than the slope of the dotted line in range A. When the well 124 is filled to the level of the barrier 128, as additional charge enters the cell 116 the potential in each well increases by the same amount (FIG. 7C and range C in FIG. 8). Over the range C, the slope of the voltage versus packet size curve (the dot-dashed line) is less than the slope of the dashed line in range B. Finally, when the cell 116 is full (FIG. 7D and range D in FIG. 8), introduction of additional charge has no effect on the potential in either well.

The properties of the amplifiers 152 and 156 are selected to take advantage of the fact that the sensitivity of the row 132 is greatest for low level signals and the sensitivity of the row 136 is greatest for medium level signals. Accordingly, the amplifier 152, which detects the charge in the row 132, is designed to have high gain and low noise, and therefore to amplify small charge signals without introducing substantial noise. The amplifier 156, which is associated with the row 136, has a lower gain so that it can detect a larger charge signal without distortion. Because the amplifier 156 receives larger signal charges, its noise level is inevitably higher than that of the amplifier 152.

Figure 9:
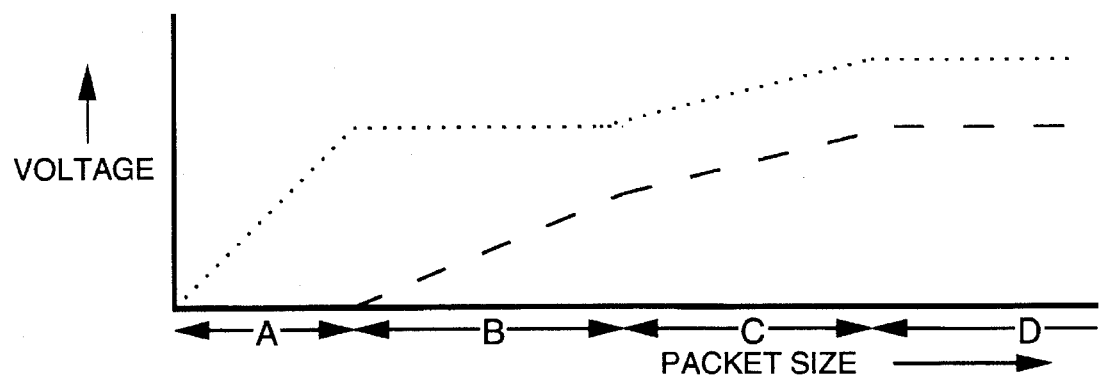
FIG. 9 is a graph illustrating another feature of operation of the CCD shown in FIG. 5.

The effect of the choice in gain factors for the amplifiers 152 and 156 on the output signal levels of the amplifiers for the different signal ranges shown in FIG. 8 is illustrated in FIG. 9. It will be noted that the relative shape of the dotted and dashed curves in FIG. 9 over the ranges A and B is substantially the same as the relative shapes of the two curves in FIG. 8 over these ranges. Over the ranges C and D, however, the difference in gains of the two amplifiers causes a departure from the relative shapes in FIG. 8.

By employing a split readout register, as shown in FIG. 5, in conjunction with readout amplifiers that are matched to the capacities of the two portions of the readout register, the CCD shown in FIG. 5 is freed from the compromise between amplifier sensitivity and charge packet size, and accordingly the CCD shown in FIG. 5 is able to provide signals with a dynamic range that is considerably greater than 200,000:1 and may even be as great as 1,000,000:1.

Figure 10:
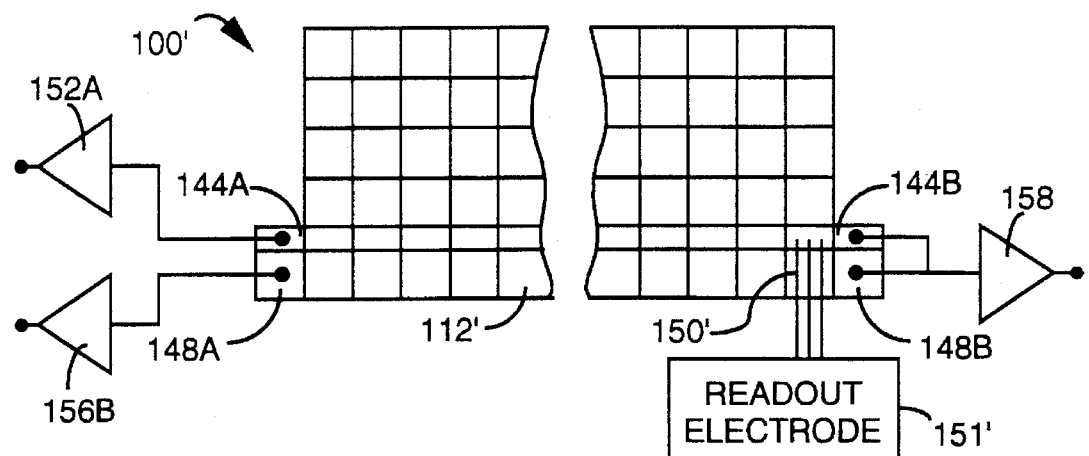
FIG. 10 is a partial plan view of a second CCD embodying the present invention.

FIG. 10 shows a CCD 100' that is similar to the CCD 100 shown in FIG. 5 except that the readout register 112' has floating diffusions 144A, 148A and 144B, 148B at each end and the readout electrode driver 151', which is connected to a three-phase readout electrode structure 150', can clock the readout electrode structure selectively to shift the charge packets either to the output diffusions 144A and 148A at the left end of the readout register, as seen in FIG. 10, or to the floating diffusions 144B and 148B at the right end of the readout register.

Similarly to FIG. 5, the two floating diffusions 144A and 148A are connected to respective readout amplifiers 152A and 156A, with the gain of the amplifier 152A being higher than that of the amplifier 156A. The other two floating diffusions 144B and 148B are connected to a common readout amplifier 158, whose gain is intermediate that of the amplifiers 152A and 156A. This ensures that if there should be a fault in fabrication of the CCD, such that it is not possible to take advantage of the difference in sensitivity of the two rows of wells that form the readout register, or if the readout amplifier 152A or 156A should prove faulty, an operative device employing the amplifier 158 is nevertheless available. Alternatively, in the event that it should be determined that the source of likely faults in the device is not in the fabrication of the readout register but in the readout amplifiers, it would be possible to use dual readout amplifiers, connected to the floating diffusions 144B and 148B respectively, and thereby increase the probability that a CCD having a functional dual sensitivity readout register will be realized.

Figure 11:
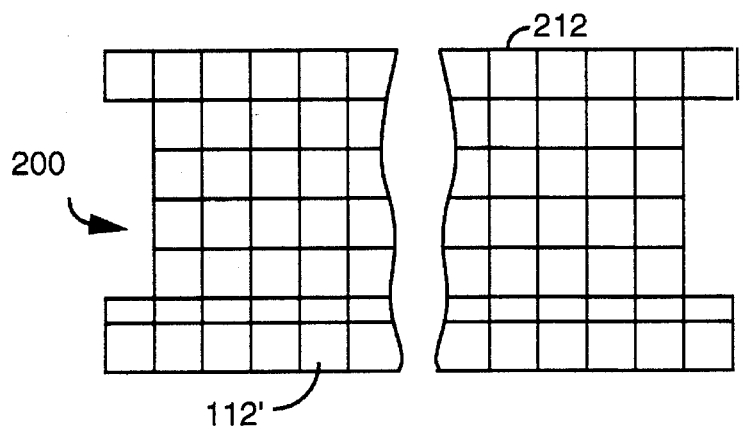
FIG. 11 is a partial plan view of a third CCD embodying the present invention.

FIG. 11 shows a CCD 200 that is similar to the CCD shown in FIG. 10 except that it comprises a second readout register 212 at the opposite edge of the sensing region from the readout register 112'. In this case, the frame electrode driver (not shown) is operative selectively to shift charge packets either into the readout register 112' or into the readout register 212. In order to maximize yield of useful devices, it is preferred that the readout register 212 should comprise a single row of transfer cells provided with a floating diffusion at each end, with each floating diffusion feeding a detection circuit of conventional form. If, for example due to manufacturing difficulties, the split readout register 112' does not function, the single-row readout register 212 can be used instead. However, depending on requirements, the readout register 212 may be designed to comprise two rows of wells and be provided with two pairs of floating diffusions, one pair at each end, with each pair of floating diffusions feeding either dual amplifiers (like the amplifiers 152A and 156A) or a common amplifier (like the amplifier 158). The latter arrangement provides the advantage that a dual sensitivity readout register is available so long as either readout register functions properly.

Figure 12:
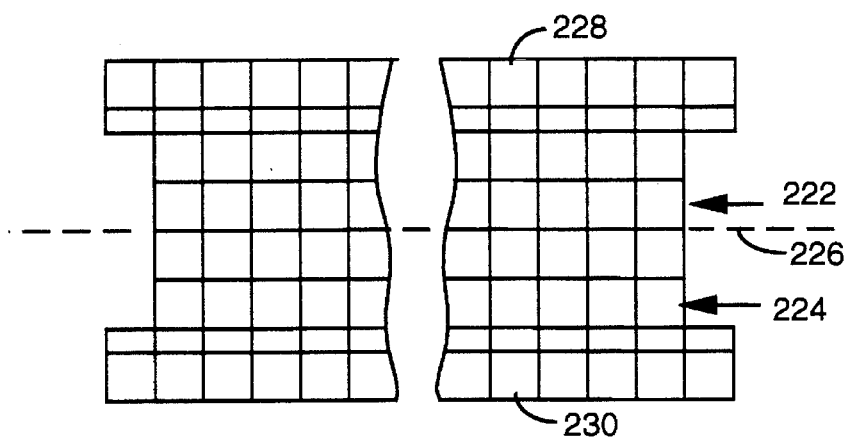
FIG. 12 is a partial plan view of a fourth CCD embodying the present invention.

FIG. 12 illustrates a CCD 220 that allows the dual sensitivity readout register concept to be applied to a dual-beam spectrometer. As shown in FIG. 12, the sensing region of the CCD 220 has two portions 222 and 224, respectively above and below the line 226. The portion 222 receives a reference beam while the portion 224 receives a sample beam. The frame electrode structure (not shown) is driven so that the pixel charges in the upper sensing portion 222 are clocked into a readout register 228 while the pixel charges in the sensing portion 224 are clocked into a readout register 230. The readout electrode structure (not shown) is driven so that the charge packets are shifted either into the floating diffusions 234A, 236A or into the floating diffusions 234B, 236B.

Figure 1:
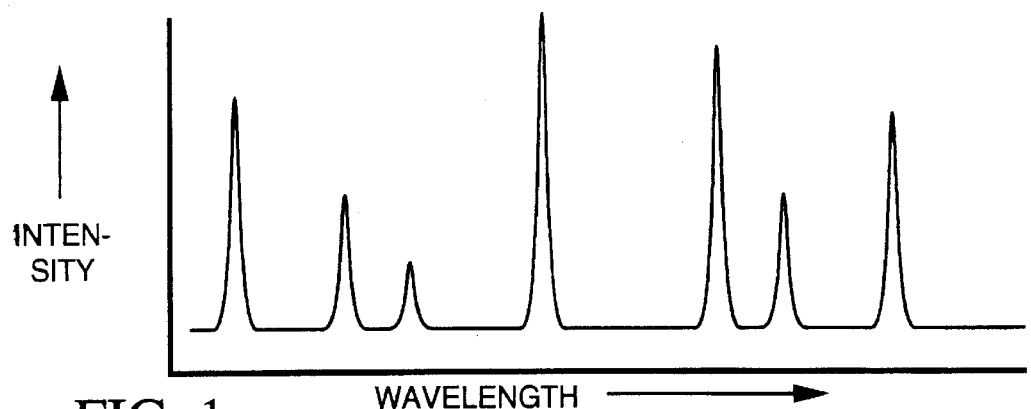
FIG. 1 is a graph illustrating light intensity as a function of position along the wavelength axis in the image plane of an emission spectroscope.
Figure 2:
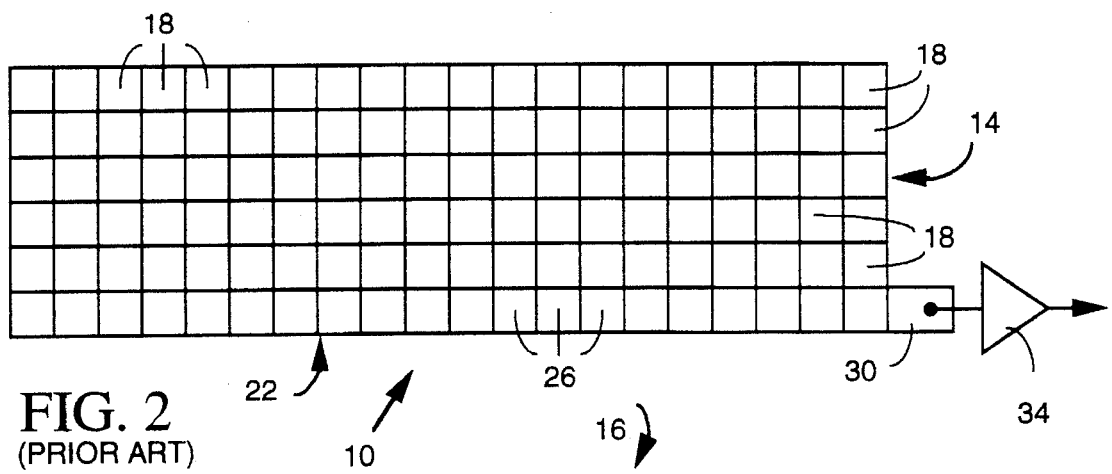
FIG. 2 is a diagrammatic plan view of the front surface of a CCD for spectroscopic detection.
Figure 3:
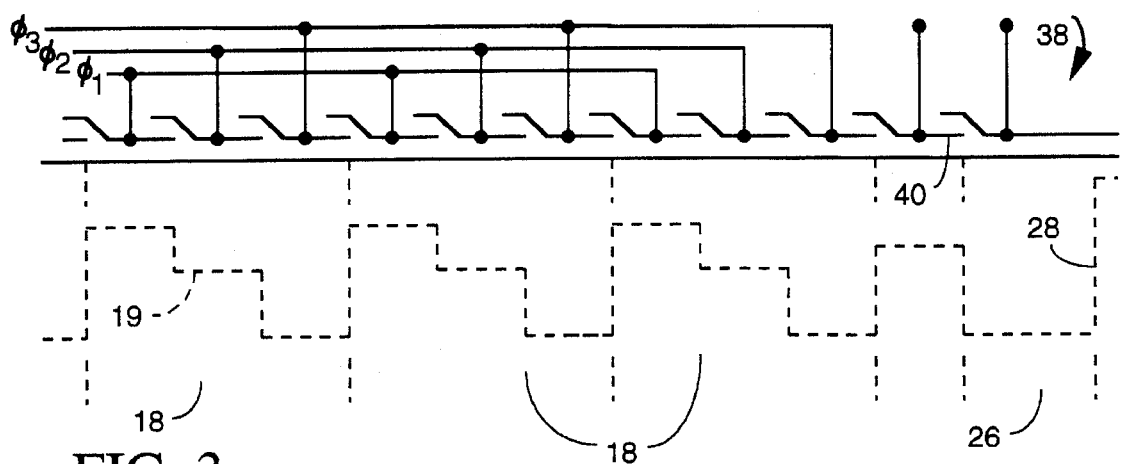
FIG. 3 is a partial sectional view of the CCD shown in FIG. 2, illustrating variation in potential in a segment of one column of pixels and the associated transfer cell of the readout register.
Figure 4:
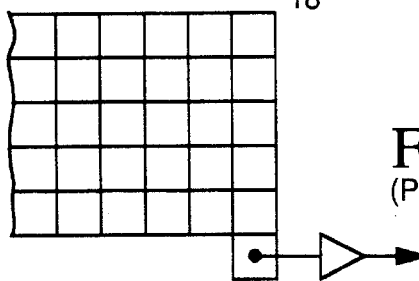
FIG. 4 is a plan view of a second CCD for spectroscopic detection.

It will be appreciated that the invention is not restricted to the particular embodiments that have been described and illustrated, and that variations may be made therein without departing from the scope of the invention as defined in the appended claims and equivalents thereof. For example, it is not necessary that the readout register extend parallel to the wavelength axis of the spectrometer and it may instead extend perpendicular to the wavelength axis, similarly to the arrangement shown in FIG. 4. Further, the invention is not restricted to the readout register comprising only two rows of sub-cells, and may be applied to a CCD in which the readout register has three or more rows of sub-cells separated from each other by potential barriers. In this extension, the detection circuit may comprise multiple readout amplifiers coupled to respective floating diffusions and/or at least one readout amplifier connected to multiple floating diffusions. Although implementation of the invention has been described in the context of three phase electrode structures and three phase electrode drivers, the invention is not limited to three phase technology. In a further development, in the case in which the readout register has one or more floating diffusions at each end, the readout electrode structure may be clocked so that charge packets that are nearer one end of the register are shifted to the floating diffusion(s) at that end of the register and charge packets that are nearer the opposite end of the register are shifted to the floating diffusion at that end. Further, it is not essential to all implementations of the invention that in FIG. 8 the slope of the dashed line in range B be less than the slope of the dotted in range A.

We claim:

1. A CCD comprising a sensing array and a readout register extending adjacent an edge of the sensing array, wherein the readout register has a first edge that is nearer the sensing array and a second edge that is farther from the sensing array, and the readout register is bounded along its second edge by a potential barrier of a first height and has first and second rows of transfer cells between its first and second edges, the first row being between the sensing array and the second row, whereby charge shifted from the sensing array into the readout register enters the first row of transfer cells, and the transfer cells of the first row are of lower capacity than the transfer cells of the second row and are separated from the transfer cells of the second row by a potential barrier of a second height that is less than said first height.

2. A CCD according to claim 1, wherein the charge capacity of the first and second rows is more than twice the charge capacity of the sensing array.

3. A CCD according to claim 2, wherein the charge capacity of the first and second rows is at least six times the charge capacity of the sensing array.

4. A CCD according to claim 1, comprising a first amplifier connected to detect charge accumulated by the first row of transfer cells and a second amplifier connected to detect charge accumulated by the second row of transfer cells.

5. A CCD according to claim 4, wherein the first amplifier has a greater sensitivity than the second amplifier.

6. A CCD according to claim 1, wherein the readout register has first and second opposite ends and the CCD comprises a readout electrode means operative selectively for transferring charge in the readout register either to the first end of the readout register or to the second end of the readout register, a first amplifier means for detecting charge transferred to the first end of the readout register, and a second amplifier means for detecting charge transferred to the second end of the readout register.

7. A CCD according to claim 6, wherein the first amplifier means comprises a first amplifier for detecting charge transferred in the first row of transfer cells and a second amplifier for detecting charge transferred in the second row of transfer cells, the first amplifier having a greater sensitivity than the second amplifier.

8. A CCD according to claim 6, wherein the first amplifier means comprises a first amplifier for detecting charge transferred in the first row of transfer cells and a second amplifier for detecting charge transferred in the second row of transfer cells, the first amplifier having a greater sensitivity than the second amplifier, and the second amplifier means comprises a summing amplifier for detecting charge transferred in the first and second rows of transfer cells.

9. A CCD according to claim 8, wherein the sensitivity of the summing amplifier is intermediate the sensitivity of the first amplifier and the sensitivity of the second amplifier.

10. A CCD comprising a sensing array and a readout register extending adjacent an edge of the sensing array, the readout register having a first edge that is nearer the sensing array and a second edge that is farther from the sensing array, the readout register being bounded along its second edge by a potential barrier of a first height and comprising at least one charge accumulation cell for receiving and accumulating charge shifted into the accumulation cell from a source cell of the CCD, and wherein the charge accumulation cell has a first sub-cell and a second sub-cell of greater capacity than the first sub-cell, the first sub-cell being between the source cell and the second sub-cell, whereby charge shifted into the charge accumulation cell from the source cell enters the first sub-cell, and the first sub-cell being separated from the second sub-cell by a potential barrier of a second height that is less than said first height.

11. A CCD according to claim 10, comprising a first amplifier for detecting charge accumulated in the first sub-cell and a second amplifier for detecting charge accumulated in the second sub-cell.

12. A CCD comprising a sensing array having first and second sensing regions, the sensing array having first and second edges bounding the first and second sensing regions respectively, and the CCD further comprising a first readout register means adjacent the first edge of the sensing array, a second readout register means adjacent the second edge of the sensing array, and an electrode means operative selectively for shifting charge from the sensing array either to the first readout register means or to the second readout register means, and wherein the first readout register means has a first edge that is nearer the sensing array and a second edge that is farther from the sensing array, and the first readout register means is bounded along its second edge by a potential barrier of a first height and has first and second rows of transfer cells between its first and second edges, the first row being between the sensing array and the second row, whereby charge that is shifted from the sensing array into the first readout register means enters the first row of transfer cells, and the transfer cells of the first row are of lower capacity than the transfer cells of the second row and are separated from the transfer cells of the second row by a potential barrier of a second height that is less than said first height.

13. A CCD according to claim 12, wherein the electrode means comprises a first electrode means for shifting charge from the first region of the sensing array into the first readout register means, and a second electrode means for shifting charge from the second region of the sensing array into the second readout register means.

14. A CCD according to claim 12, comprising a first amplifier means for detecting charge accumulated by the first row of transfer cells and a second amplifier means for detecting charge accumulated by the second row of transfer cells.

15. A CCD according to claim 14, wherein the first amplifier means has a greater sensitivity than the second amplifier means.

16. A CCD according to claim 12, comprising a first amplifier means for detecting charge accumulated by the first readout register means and a second amplifier means for detecting charge accumulated by the second readout register means.

17. A CCD according to claim 12, wherein the first readout register means has first and second opposite ends and the CCD comprises readout electrode means operative selectively for transferring charge in the first readout register means either to the first end of the first readout register means or to the second end of the first readout register means, a first amplifier means for detecting charge transferred to the first end of the first readout register means, and a second amplifier means for detecting charge transferred to the second end of the first readout register means.

18. A CCD according to claim 17, wherein the first amplifier means comprises a first amplifier connected to detect charge transferred to the first end of the first readout register means by the first row of transfer cells, and a second amplifier connected to detect charge transferred to the first end of the first readout register means by the second row of transfer cells.

19. A CCD according to claim 17, wherein the second readout register means has first and second opposite ends and the CCD comprises second readout electrode means operative selectively for transferring charge in the second readout register means either to the first end of the second readout register means or to the second end of the second readout register means, a third amplifier means for detecting charge transferred to the first end of the second readout register means, and a fourth amplifier means for detecting charge transferred to the second end of the second readout register means.

20. A CCD according to claim 19, wherein each of the first and second readout register means has first and second rows of transfer cells and each of said first, second, and third, and fourth amplifier means comprises a first amplifier connected to detect charge transferred by the first row of the associated readout register means and a second amplifier connected to detect charge transferred by the second row of the associated readout register means.

21. A CCD comprising a sensing array having first and second edges, and first and second readout registers extending adjacent said first and second edges respectively of the sensing array, wherein at least the first readout register has a first edge that is nearer the sensing array and a second edge that is farther from the sensing array, and the first readout register is bounded along its first edge by a potential barrier of a first height and has first and second rows of transfer cells between its first and second edges, the first row being between the sensing array and the second row, whereby charge shifted from the sensing array into the first readout register enters the first row of transfer cells, and the transfer cells of the first row are of lower capacity than the transfer cells of the second row and are separated from the transfer cells of the second row by a potential barrier of a second height that is less than said first height.

22. A CCD according to claim 21, wherein the second readout register has first and second rows of transfer cells, the first row being between the sensing array and the second row, and the transfer cells of the first row are of lower capacity than the transfer cells of the second row and are separated from the transfer cells of the second row by a potential barrier.

23. A CCD according to claim 12, wherein the second readout register means has a first edge that is nearer the sensing array and a second edge that is farther from the sensing array, and the second readout register means is bounded along its second edge by a potential barrier and has first and second rows of transfer cells between its first and second edges, the first row of transfer cells of the second readout register means being between the sensing array and the second row, whereby charge that is shifted from the sensing array into the second readout register means enters the first row of transfer cells, and the transfer cells of the first row of the second readout register means are of lower capacity than the transfer cells of the second row thereof and are separated from the transfer cells of the second row by a potential barrier of a height that is less than that of the potential barrier that bounds the second readout register means at the second edge thereof.

* * * * *